(12) United States Patent
Liou et al.

(10) Patent No.: US 9,117,927 B2
(45) Date of Patent: Aug. 25, 2015

(54) METHOD OF SEMICONDUCTOR INTEGRATED CIRCUIT FABRICATION

(71) Applicant: Taiwan Semiconductor Manufacturing Company, Ltd., Hsin-Chu (TW)

(72) Inventors: Kuen-Ming Liou, Tainan (TW); Chia-Ying Lee, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 34 days.

(21) Appl. No.: 14/158,470

(22) Filed: Jan. 17, 2014

(65) Prior Publication Data

US 2015/0206804 A1 Jul. 23, 2015

(51) Int. Cl.
| | | |
|---|---|---|
| *H01L 21/44* | (2006.01) |
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 21/8234* | (2006.01) |
| *H01L 29/49* | (2006.01) |
| *H01L 29/51* | (2006.01) |
| *H01L 27/088* | (2006.01) |
| *H01L 21/768* | (2006.01) |
| *H01L 21/311* | (2006.01) |

(52) U.S. Cl.
CPC .. *H01L 21/823475* (2013.01); *H01L 21/31111* (2013.01); *H01L 21/31133* (2013.01); *H01L 21/31144* (2013.01); *H01L 21/76802* (2013.01); *H01L 21/76877* (2013.01); *H01L 21/76897* (2013.01); *H01L 27/088* (2013.01); *H01L 29/495* (2013.01); *H01L 29/4966* (2013.01); *H01L 29/517* (2013.01)

(58) Field of Classification Search
CPC .............. H01L 21/823475; H01L 21/76897; H01L 29/495; H01L 29/4966
USPC ......................................... 438/664; 257/368
See application file for complete search history.

(56) References Cited

U.S. PATENT DOCUMENTS

2015/0091093 A1* 4/2015 Bouche et al. ................ 257/369

* cited by examiner

*Primary Examiner* — David S Blum
(74) *Attorney, Agent, or Firm* — Haynes and Boone, LLP

(57) ABSTRACT

A method of fabricating a semiconductor integrated circuit (IC) is disclosed. A high-k/metal gate (HK/MG) and a conductive feature are disposed over a substrate, separated by a first dielectric layer. A global hard mask (GHM) layer is formed over the HK/MG, the conductive feature and the first dielectric layer. A second dielectric layer is then formed over the GHM layer. The second dielectric layer is etched to form a first opening to expose a portion of the HK/MG and a second opening to expose a portion of the conductive feature, by using the GHM layer as an etch stop layer. The GHM layer in the first opening and the second opening is then removed.

20 Claims, 7 Drawing Sheets

METHOD OF SEMICONDUCTOR INTEGRATED CIRCUIT FABRICATION

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. One area is the wiring, or interconnects, between the transistors and other devices. Although existing methods of fabricating IC devices have been generally adequate for their intended purposes, they have not been entirely satisfactory in all respects. For example, challenges rise to develop improved dielectric and metal interconnection processes and structures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
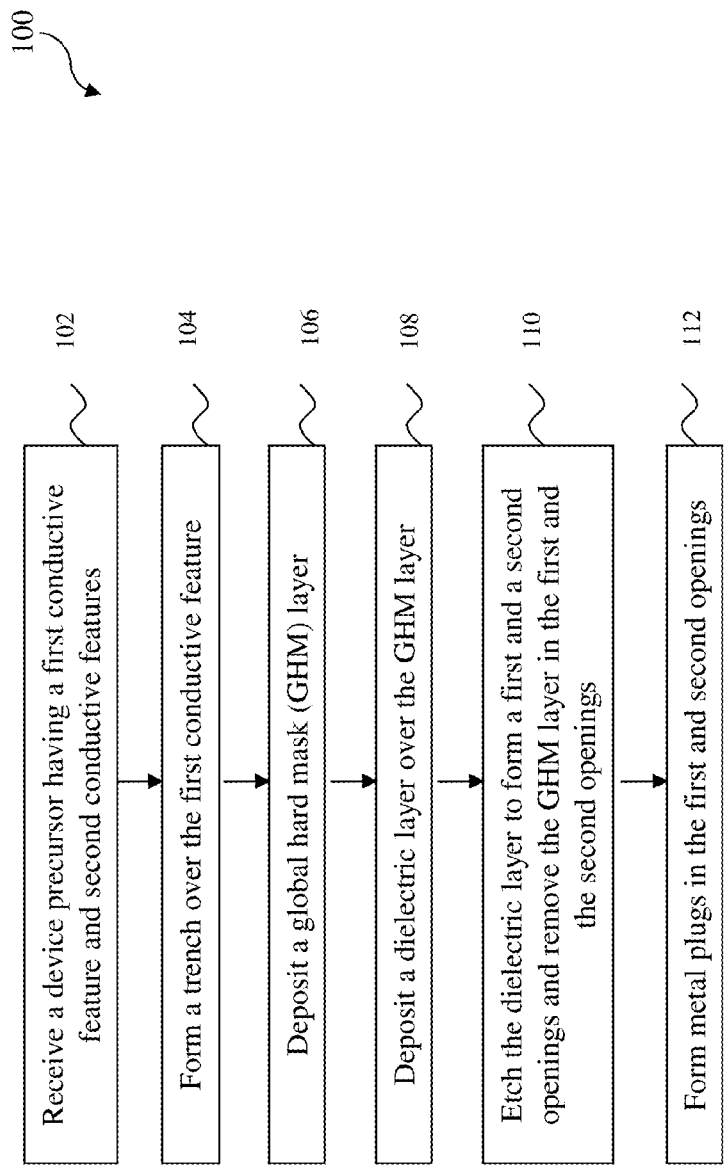
FIG. 1 is a flowchart of an example method for fabricating a semiconductor integrated circuit (IC) constructed according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a flowchart of one embodiment of a method 100 of fabricating one or more semiconductor devices according to aspects of the present disclosure. The method 100 is discussed in detail below, with reference to a semiconductor device precursor 200 shown in FIG. 2 and a semiconductor device 600 shown in FIGS. 2 to 7 for the sake of example. It is understood that additional steps can be provided before, during, and after the method, and some of the steps described can be replaced or eliminated for other embodiments of the method.

Figure 2:
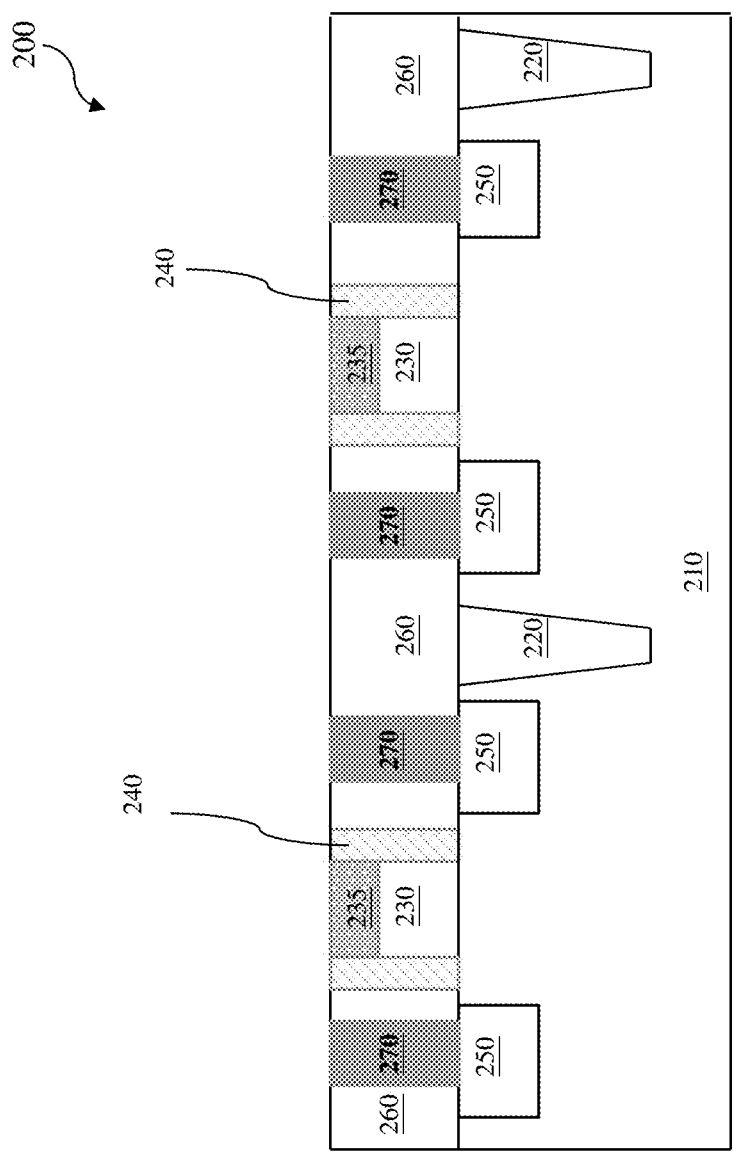
FIGS. 2 to 7 are cross-sectional views of an example semiconductor integrated circuit (IC) at fabrication stages constructed according to the method of FIG. 1.

Referring to FIGS. 1 and 2, the method 100 begins at step 102 by receiving a semiconductor device precursor 200. The semiconductor device precursor 200 includes a substrate 210. In the present embodiment, the substrate 210 includes silicon. In alternative embodiments, the substrate may include germanium, silicon germanium, gallium arsenide or other appropriate semiconductor materials. Alternatively and for some embodiments, the substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or other appropriate methods. In fact various embodiments may include any of a variety of substrate structures and materials.

The semiconductor device precursor 200 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The semiconductor device precursor 200 also includes one or more first conductive features 230. In one embodiment, the first conductive features 230 may include high-k/metal gates (HK/MGs) and/or a three-dimension HK/MGs wrapping over a fin-like structure. As an example, the HK/MGs may include a gate dielectric layer and metal gate (MG). The gate dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The MG may include a single layer or multi layers, such as a metal layer, a liner layer, a wetting layer, and an adhesion layer. The MG may include Ti, Ag, Al, TiAlN, TaC, TaCN, TaSiN, Mn, Zr, TiN, TaN, Ru, Mo, Al, WN, Cu, W, or any suitable materials.

Additionally, a local hard mask layer 235 may be formed on top of the HK/MG 230. The local hard mask (LHM) layer 235 includes titanium oxide, tantalum oxide, silicon nitride, silicon oxide, silicon carbide, silicon carbide nitride, or other suitable material. The LHM layer 235 be formed by deposition and etch processes.

Sidewall spacers 240 may also be formed on the sidewalls of the HK/MG 230. The sidewall spacers 240 may include a dielectric material such as silicon oxide. Alternatively, the sidewall spacers 240 may include silicon nitride, silicon carbide, silicon oxynitride, or combinations thereof. The sidewall spacers 240 may be formed by deposition and dry etching processes known in the art.

The semiconductor device precursor 200 also includes second conductive features 250 in the substrate 210. In one embodiment, the second conductive features 250 include doped regions (such as sources or drains), or gate electrodes. In another embodiment, the second conductive features 250 include electrodes, capacitors, resistors or a portion of a resistor, or a portion of the interconnect structure.

The semiconductor device precursor 200 also includes a first dielectric layer 260 deposited over the substrate 210, including between/over each of the first conductive features 230 and over the second conductive features 250. The first dielectric layer 260 includes silicon oxide, silicon nitride, oxynitride, a dielectric material having a dielectric constant (k) lower than thermal silicon oxide (therefore referred to as low-k dielectric material layer), or other suitable dielectric material layer. The first dielectric layer 260 includes a single layer or multiple layers. The first dielectric layer 260 may be deposited by chemical vapor deposition (CVD), atomic layer deposition (ALD) or spin-on coating.

In some embodiments and as shown in FIG. 1, the top surfaces of the second conductive features 250 are horizontally below the top surfaces of the first conductive features 230, therefore the semiconductor device precursor 200 may also include a first metal plug 270 to form contacts extending down to the second conductive features 250. The first metal plug 270 may include copper (Cu), aluminum (Al), tungsten (W), copper or copper alloy, such as copper magnesium (CuMn), copper aluminum (CuAl) or copper silicon (CuSi), or other suitable conductive material. The first metal plug may be formed by suitable process, such as deposition, patterning and etching.

A CMP may be performed to remove excessive material from the first dielectric layer 260 to expose the top surface of the first metal plug 270 and a top surface of the LHM layer 235, as well as to provide a substantially planar top surface for the first metal plug 270, the first conductive feature 230 and the first dielectric layer 260.

Figure 3:
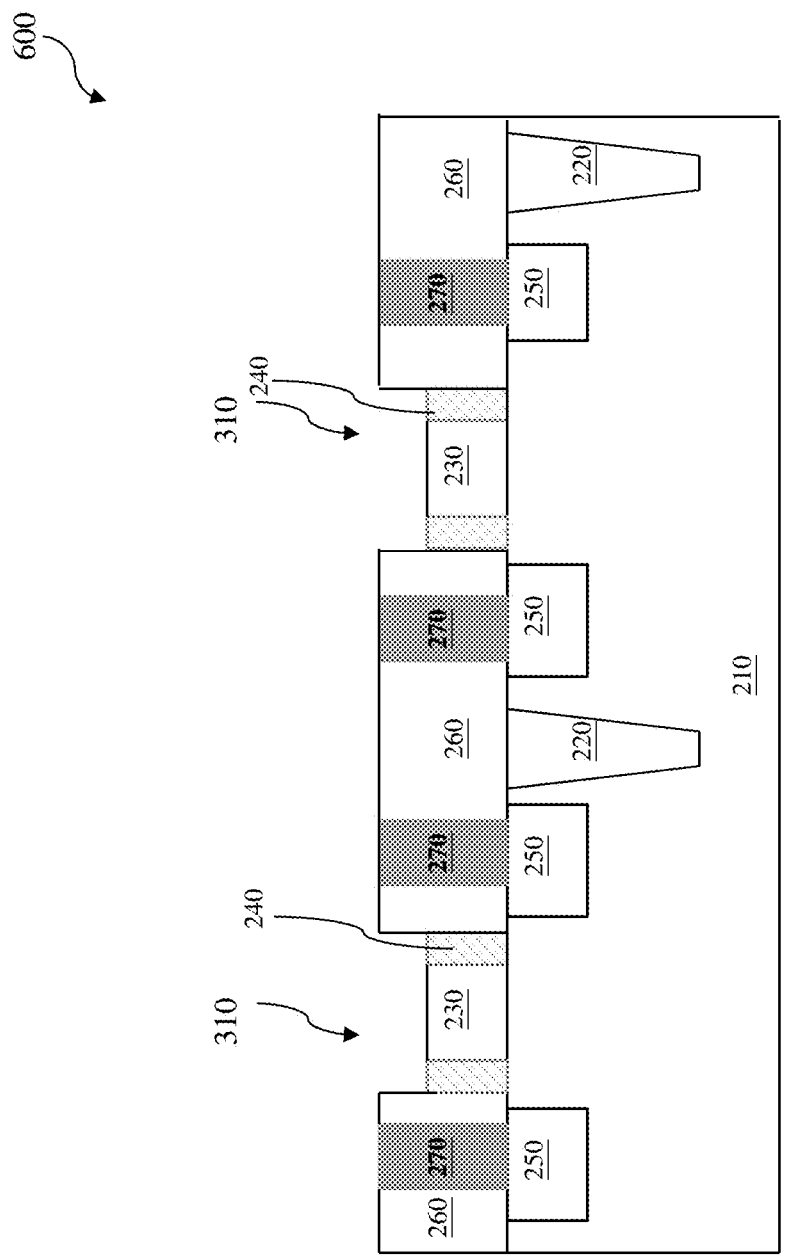

Referring to FIGS. 1 and 3, once the semiconductor device precursor 200 is received, the method 100 proceeds to step 104 by removing the LHM layer 235 and etching back the sidewall spacer 240 to form a trench 310. A top surface of the first conductive feature 230, such as the HK/MG 230, is exposed in the trench 310. The trench 310 may be formed by lithography patterning and etching processes.

Figure 4:
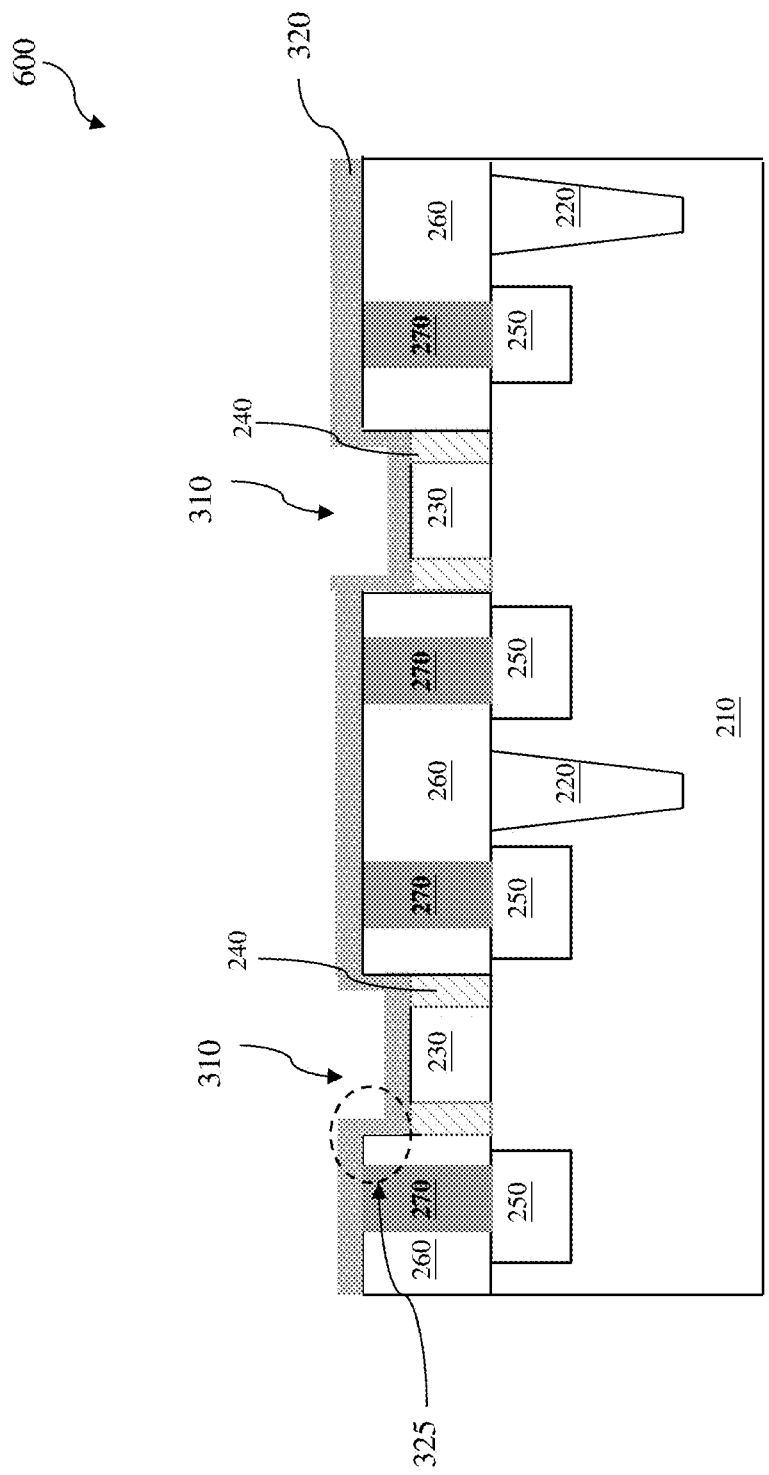

Referring to FIGS. 1 and 4, the method 100 proceeds to step 106 by depositing a global hard mask (GHM) layer 320 over the trench 310 including over the first conductive feature 230 and the recessed sidewall spacer 240, over the first dielectric layer 260 and the first metal plug 270. The GHM layer 320 has a step-shape profile 325 when it is formed extended from the first dielectric layer 260 to the trench 310. The GHM layer 320 may include titanium oxide, tantalum oxide, silicon nitride, silicon oxide, silicon carbide, silicon carbide nitride, or other suitable material. The GHM layer 320 may be deposited by any suitable techniques, such as CVD, PVD and ALD. The GHM layer 320 will serve as an etch stop layer in a future etching, which will be described in the following description.

Figure 5:
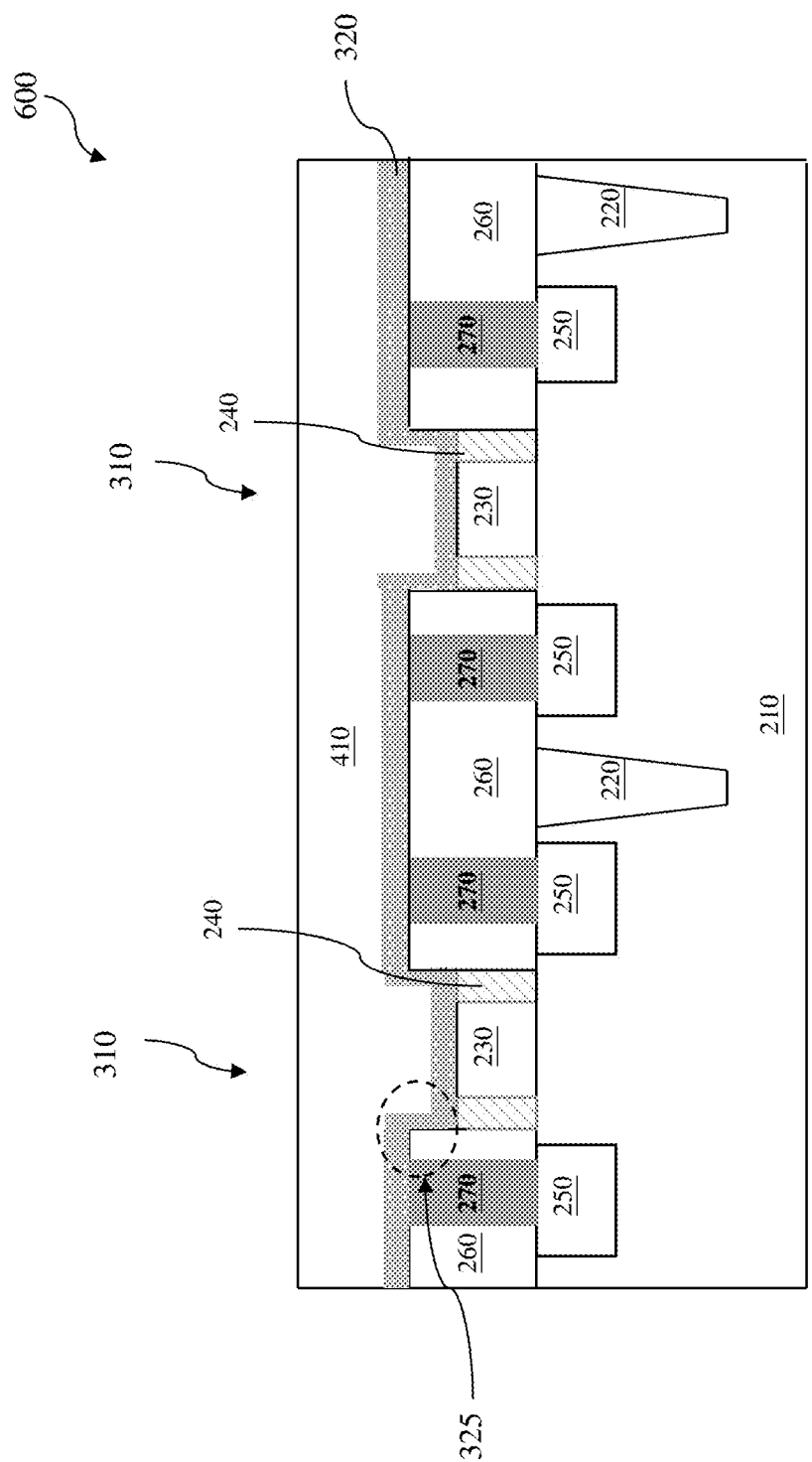

Referring to FIGS. 1 and 5, the method 100 proceeds to step 108 by depositing a second dielectric layer 410 over the GHM layer 320. The second dielectric layer 410 is similar in many respects to the first dielectric layer 260 discussed above in association with FIG. 2. In the present embodiments, the second dielectric layer 410 is different from the GHM layer 320 to achieve etching selectivity during a subsequent etch, which will be described in the following description.

Figure 6:
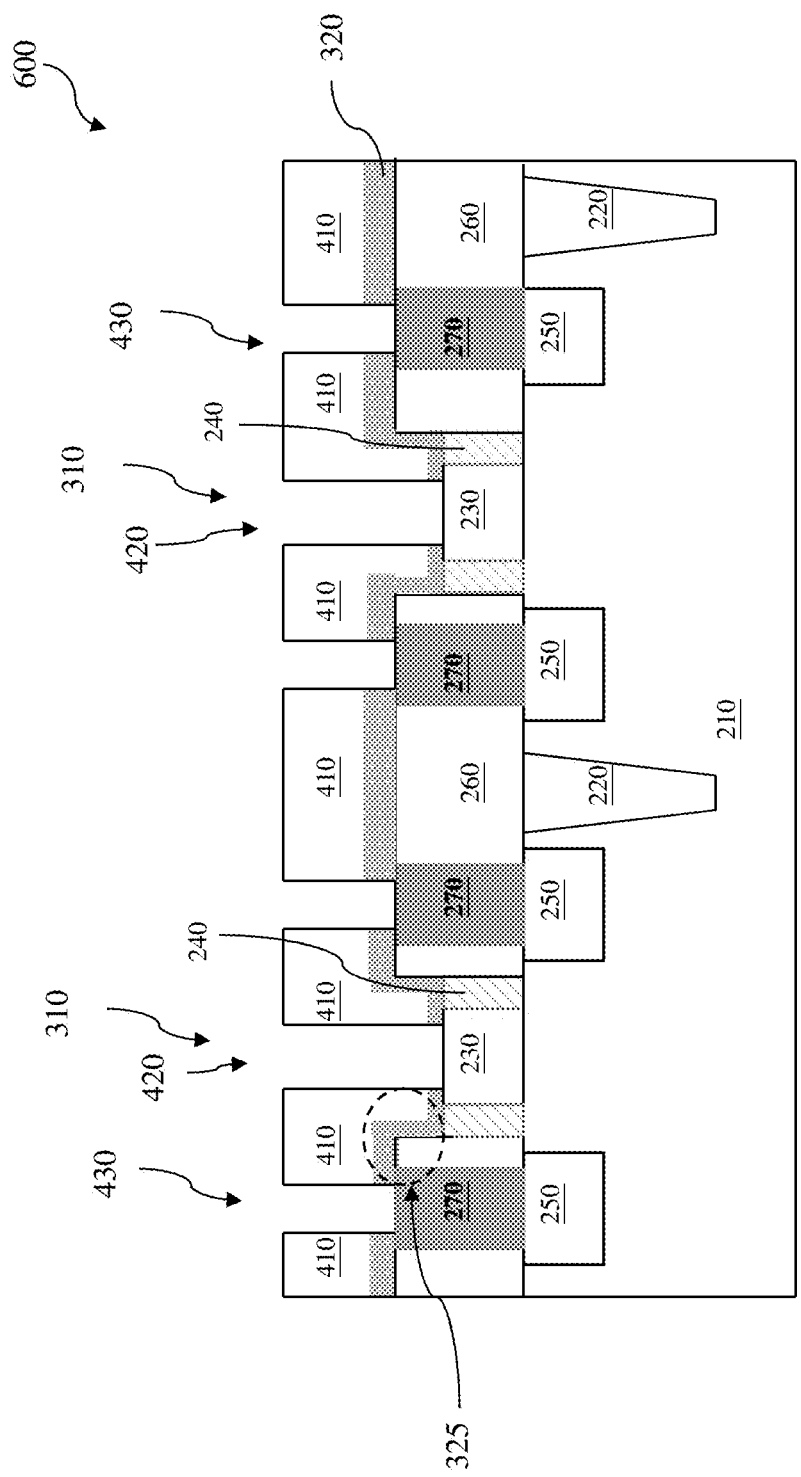

Referring to FIGS. 1 and 6, the method 100 proceeds to step 110 by patterning the second dielectric layer 410 to form a first opening 420 and a second opening 430. In present embodiment, the first opening 420 is formed aligning to the respective first conductive feature 230 and the second opening 430 is formed aligning to the respective first metal plug 270. The first opening 420 and the second opening 430 may be formed by lithography patterning and etching processes. In one embodiment, both of the first opening 420 and the second opening 430 are patterned by one lithography process. In another embodiment, the first opening 420 and the second opening 430 are patterned separately by two lithography processes.

The second dielectric layer 410 is then etched to form the first opening 420 and the second opening 430. The etching selectively removes the second dielectric layer 410 but substantially does not etch the GHM layer 320. In another words, the GHM layer 320 serves as an etch stop layer. With the GHM layer 320, etching process constrains are relaxed and process window is improved, especially when the first conductive feature 230 and the first metal plug 270 locate in a substantially different horizontal level and formed by different materials.

In the present embodiment, after the GHM layer 320 is exposed in the first opening 420 and the second opening 430, another etching is performed to remove the GHM layer 320 in the first opening 420 and the second opening 430. The GHM layer 320 may be removed in an additional etch step by using the same etching tool for etching the second dielectric layer 410 with a different etch conditions, such as gases, or chemicals. Alternatively, the GHM layer 320 may be removed by a separate etch process in a different etch tool. Thus, at the bottom of the first opening 420, a portion of the first conductive features 230 is exposed and at the bottom of the second opening 430, a portion of the first metal plug 270 is exposed. The GHM layer 320 remains over the recessed sidewall spacer 240 in the trench 310 and the second dielectric layer 260. In one embodiment, the GHM layer 320 remains on a portion of the first conductive feature 230 and a portion of the first metal plug 270 as well.

Figure 7:
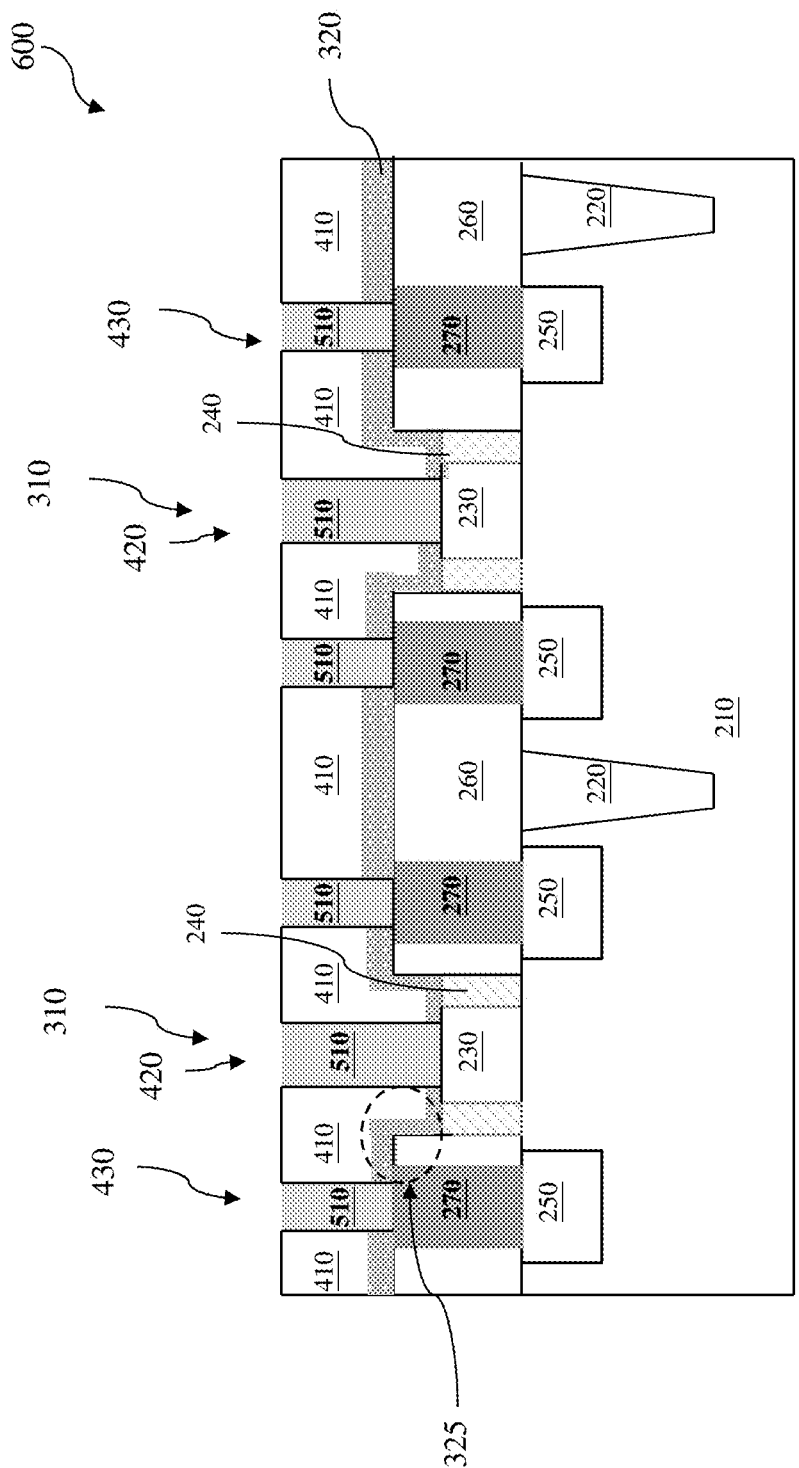

Referring to FIGS. 1 and 7, the method 100 proceeds to step 112 by forming second metal plugs 510 in the first openings 420 to form full contacts extending down to the first conductive features 230 and in the second opening 430 to form full contact extending down to the first metal plug 270. In one embodiment, a barrier layer is formed in the first and the second openings, 420 and 430, first by a proper deposition technique, such as PVD and CVD. The barrier layer may include a metal and is electrically conductive but does not permit inter-diffusion and reactions between the second dielectric layer 410 and the metal layer 510 to be filled in the first and the second openings, 420 and 430. The barrier layer may include refractory metals and their nitrides. In various examples, the barrier layer includes TiN, TaN, Co, WN, TiSiN, TaSiN, or combinations thereof. The barrier layer may include multiple films.

The metal layer 510 then fills in the first and the second openings, 420 and 430, as well as over the barrier layer. The metal layer 510 may include copper (Cu), aluminum (Al), tungsten (W), copper or copper alloy, such as copper magnesium (CuMn), copper aluminum (CuAl) or copper silicon (CuSi), or other suitable conductive material. The metal layer 510 may be deposited by y PVD, CVD, metal-organic chemical vapor deposition (MOCVD), or plating. Additionally, a CMP is performed to etch back the excessive metal layer 510, as well as the excessive barrier layer, and the second dielectric layer 410 and provide a substantially planar surface.

Additional steps can be provided before, during, and after the method 100, and some of the steps described can be replaced, eliminated, or moved around for additional embodiments of the method 100. The device 600 may undergo further CMOS or MOS technology processing to form various features and regions.

Based on the above, the present disclosure offers a method for fabricating a semiconductor device. The method employs forming a global hard mask layer as an etch stop layer during etching through a dielectric layer to form openings simultaneously to connect with conductive features, which not only locate at substantially different horizontal level but also are formed by different materials. The method demonstrates a robust process for interconnection with a relaxed process constrains and improved process window and simplicity.

The present disclosure provides many different embodiments of fabricating a semiconductor IC that provide one or more improvements over existing approaches. In one embodiment, a method for fabricating a semiconductor integrated circuit (IC) includes providing a device precursor. The device precursor includes a high-k/metal gate (HK/MG) over a substrate, a conductive feature over the substrate and a first dielectric layer separating the HK/MG and the conductive feature. The method also includes forming a global hard mask (GHM) layer over the HK/MG, the conductive feature and the first dielectric layer, forming a second dielectric layer over the GHM layer, etching the second dielectric layer to form a first opening to expose a portion of the HK/MG and a second opening to expose a portion of the conductive feature, by using the GHM layer as an etch stop layer. The method also includes removing the GHM layer in the first opening and the second opening.

In another embodiment, a method for fabricating a semiconductor IC includes providing a device precursor. The device precursor includes providing a first conductive feature and a second conductive feature in a substrate. The first conductive feature and the second conductive feature are separated by a first dielectric layer. a top surface of the first conductive feature is below a top surface of the first conductive features, horizontally. The method also includes forming a global hard masks (GHM) layer over the first conductive feature, the second conductive feature and the first dielectric layer. The method also includes forming a second dielectric layer over the GHM layer, etching the second dielectric layer to form a first opening to expose a portion of first conductive feature and a second opening to expose a portion of the second conductive feature, by using the GHM layer as an etch stop layer. The method also includes removing the GHM layer in the first opening and the second opening and forming metal plugs in the first opening to connect to the first conductive feature and in the second opening to connect to the second conductive feature.

In yet another embodiment, a semiconductor IC includes a substrate, a high-k/metal gate (HK/MG) over the substrate, a source and drain (S/D) over the substrate, a first metal plug on the S/D, a first dielectric layer between HK/MG and the first metal plug. A top surface of the HK/MG is below a top surface of adjacent first dielectric layer, horizontally. The semiconductor IC also includes a global hard mask (GHM) layer over the first dielectric layer, the HK/MG and the first metal plug. The GHM layer is formed in a step-shape profile from the first dielectric layer to the HK/MG. The semiconductor IC also includes a second dielectric layer over the GHM layer, a first opening through the second dielectric layer and the GHM layer to expose a portion of the HK/MG and a second opening through the second dielectric layer and the GHM layer to expose a portion of the metal plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor integrated circuit (IC), the method comprising:
   providing a device precursor, including:
      a high-k/metal gate (HK/MG) over a substrate;
      a conductive feature over the substrate; and
      a first dielectric layer separating the HK/MG and the conductive feature;
   forming a global hard mask (GHM) layer over the HK/MG, the conductive feature and the first dielectric layer;
   forming a second dielectric layer over the GHM layer;
   forming a first and a second openings in the second dielectric layer; and
   removing the GHM layer in the first opening and the second opening.

2. The method of claim 1, further comprising:
   forming a local hard mask (LHM) above the HK/MG; and
   forming a sidewall spacer along the HK/MG.

3. The method of claim 2, wherein prior to forming the GHM layer, removing the LHM to expose the HK/MG and recessing the sidewall spacer.

4. The method of claim 3, wherein the GHM layer is deposited over the HK/MG and the recessed sidewall spacer.

5. The method of claim 1, wherein the forming the first and second openings includes etching the second dielectric layer to form the first opening to expose a portion of the HK/MG and the second opening to expose a portion of the conductive feature, by using GHM layer as an etch stop layer.

6. The method of claim 5, wherein the photoresist pattern includes a first component for the first opening and a second component for the second opening, and wherein the first and second components are formed in two separate lithography processes.

7. The method of claim 5, wherein the photoresist pattern includes a first component for the first opening and a second component for the second opening, and wherein the first and second components are formed in a single lithography process.

8. The method of claim 5, further comprising:
selectively etching the second dielectric layers through the photoresist pattern, wherein the selective etch has selectivity with respect to the GHM layer.

9. The method of claim 1, wherein the GHM layer in the first opening and the second opening is removed in the same etching equipment of etching the second dielectric layer.

10. The method of claim 1, further comprising:
filling in the first and second openings with a metal layer; and
recessing the metal layer to form metal plugs in the first and second openings.

11. A method for fabricating a semiconductor integrated circuit (IC), the method comprising:
providing a first conductive feature and a second conductive feature in a substrate, separated by a first dielectric layer, wherein a top surface of the first conductive feature is below a top surface of the first conductive features, horizontally;
forming a global hard mask (GHM) layer over the first conductive feature, the second conductive feature and the first dielectric layer;
forming a second dielectric layer over the GHM layer;
patterning the second dielectric layer to form a first opening to expose a portion of first conductive feature and a second opening to expose a portion of the second conductive feature, by using the GHM layer as an etch stop layer;
removing the GHM layer in the first opening and the second opening; and
forming a first metal plug in the first opening to connect to the first conductive feature and a second metal plug in the second opening to connect to the second conductive feature.

12. The method of claim 11, wherein the forming of the first and second openings includes:
forming a photoresist pattern over the second dielectric layer; and
selectively etching the second dielectric layers through the photoresist pattern, wherein the selective etch has selectivity with respect to the GHM layer.

13. The method of claim 12, wherein the photoresist pattern includes a first component for the first opening and a second component for the second opening, and wherein the first and second components are formed in two separate lithography processes.

14. The method of claim 12, wherein the photoresist pattern includes a first component for the first opening and a second component for the second opening, and wherein the first and second components are formed in a single lithography process.

15. The method of claim 11, wherein the GHM layer in the first opening and the second opening is removed by the same etching equipment of etching the second dielectric layer.

16. A semiconductor integrated circuit (IC), the IC comprising:
a substrate;
a high-k/metal gate (HK/MG) over the substrate;
a source and drain (S/D) over the substrate;
a first metal plug on the S/D;
a first dielectric layer between HK/MG and the first metal plug, wherein a top surface of the HK/MG is below a top surface of adjacent first dielectric layer, horizontally;
a global hard mask (GHM) layer over the first dielectric layer, the HK/MG and the first metal plug, wherein the GHM layer formed in a step-shape profile from the first dielectric layer to the HK/MG;
a second dielectric layer over the GHM layer;
a first opening through the second dielectric layer and the GHM layer to expose a portion of the HK/MG; and
a second opening through the second dielectric layer and the GHM layer to expose a portion of the metal plug.

17. The IC of claim 16, further comprising;
a sidewall spacer formed along the HK/MG sidewall, wherein a top surface of the sidewall spacer has a same horizontal level as a top surface of the HK/MG.

18. The IC of claim 17, wherein the GHM deposited over the top surface of the sidewall spacer.

19. The IC of claim 18, wherein the GHM formed in a step-shape profile from the first dielectric layer to the sidewall spacer.

20. The IC of claim 16, further comprising:
a second metal plug in the first opening to connect a portion of the HK/MG; and
a third metal plug in the second opening to connect to a portion of the first metal plug.

* * * * *